United States Patent
Ju et al.

(10) Patent No.: US 9,922,620 B2
(45) Date of Patent: Mar. 20, 2018

(54) DATA PROCESSING APPARATUS FOR PERFORMING DISPLAY DATA COMPRESSION/DECOMPRESSION WITH COLOR FORMAT CONVERSION AND RELATED DATA PROCESSING METHOD

(71) Applicant: MEDIATEK INC., Hsin-Chu (TW)

(72) Inventors: Chi-Cheng Ju, Hsinchu (TW);
Tsu-Ming Liu, Hsinchu (TW)

(73) Assignee: MEDIATEK INC., Hsin-Chu (TW)

( * ) Notice: Subject to any disclaimer, the term of this patent is extended or adjusted under 35 U.S.C. 154(b) by 0 days.

(21) Appl. No.: 15/107,106

(22) PCT Filed: Mar. 18, 2015

(86) PCT No.: PCT/CN2015/074448
§ 371 (c)(1),
(2) Date: Jun. 22, 2016

(87) PCT Pub. No.: WO2015/139629
PCT Pub. Date: Sep. 24, 2015

(65) Prior Publication Data
US 2017/0025093 A1    Jan. 26, 2017

Related U.S. Application Data

(60) Provisional application No. 61/954,667, filed on Mar. 18, 2014.

(51) Int. Cl.
G09G 5/02    (2006.01)
G09G 5/06    (2006.01)
(Continued)

(52) U.S. Cl.
CPC .......... *G09G 5/006* (2013.01); *G06F 3/1415* (2013.01); *G06F 11/00* (2013.01);
(Continued)

(58) Field of Classification Search
CPC combination set(s) only.
See application file for complete search history.

(56) References Cited

U.S. PATENT DOCUMENTS 5,864,345 A * 1/1999 Wickstrom .............. G09G 5/02
345/603
5,907,374 A * 5/1999 Liu ......................... H04N 19/40
375/240.25
(Continued)

FOREIGN PATENT DOCUMENTS

CN    101110958 A    1/2008
CN    101237582 A    8/2008
(Continued)

OTHER PUBLICATIONS

"International Search Report" dated Jul. 22, 2015 for International application No. PCT/CN2015/074448, International filing date:Mar. 18, 2015.

(Continued)

*Primary Examiner* — Wesner Sajous
(74) *Attorney, Agent, or Firm* — Winston Hsu (57) ABSTRACT

A data processing apparatus has a compression circuit and an output interface. The compression circuit has a pre-processor and a compressor. The pre-processor receives a first input display data in a first color domain, and performs a color format conversion upon the first input display data to generate a second input display data in a second color domain, wherein the second color domain is different from the first color domain. The compressor performs compression in the second color domain, wherein the compressor is arranged to compress the second input display data into a compressed display data in the second color domain. The output interface packs an output display data derived from
(Continued)

the compressed display data into an output bitstream, and outputs the output bitstream via a display interface.

22 Claims, 8 Drawing Sheets (51) Int. Cl.
| | |
|---|---|
| G09G 5/04 | (2006.01) |
| H04N 1/60 | (2006.01) |
| H04N 19/00 | (2014.01) |
| H04N 19/66 | (2014.01) |
| G06F 3/14 | (2006.01) |
| G06F 11/00 | (2006.01) |
| G06F 11/10 | (2006.01) |
| G06F 13/42 | (2006.01) |
| G09G 5/00 | (2006.01) |
| G06F 11/07 | (2006.01) |
| H03M 13/00 | (2006.01) |
| G09G 5/14 | (2006.01) |
| H04N 19/436 | (2014.01) |
| H04N 19/86 | (2014.01) |
| H04N 19/426 | (2014.01) |
| G06T 1/60 | (2006.01) |

(52) U.S. Cl.
CPC ...... *G06F 11/0733* (2013.01); *G06F 11/0793* (2013.01); *G06F 11/10* (2013.01); *G06F 13/4282* (2013.01); *G06T 1/60* (2013.01); *G09G 5/04* (2013.01); *G09G 5/14* (2013.01); *H03M 13/6312* (2013.01); *H04N 19/00* (2013.01); *H04N 19/426* (2014.11); *H04N 19/436* (2014.11); *H04N 19/66* (2014.11); *H04N 19/86* (2014.11); *G09G 2310/0264* (2013.01); *G09G 2320/0606* (2013.01); *G09G 2320/0686* (2013.01); *G09G 2330/021* (2013.01); *G09G 2340/02* (2013.01); *G09G 2360/08* (2013.01); *G09G 2370/00* (2013.01); *Y02B 60/1228* (2013.01); *Y02B 60/1235* (2013.01)

(56) References Cited

U.S. PATENT DOCUMENTS

| | | | | |
|---|---|---|---|---|
| 5,970,233 A * | 10/1999 | Liu | ........................ | H04N 19/40 375/E7.198 |
| 6,320,907 B1 | 11/2001 | Pau | | |
| 6,385,571 B1 | 5/2002 | Heo | | |
| 6,389,174 B1 * | 5/2002 | Liu | ........................ | H04N 7/15 348/E7.083 |
| 6,539,120 B1 * | 3/2003 | Sita | ........................ | G06T 1/60 348/E5.108 |
| 2003/0002583 A1 * | 1/2003 | Geerlings | ............... | H04N 19/40 375/240.12 |
| 2003/0142864 A1 | 7/2003 | Bezryadin | | |
| 2003/0206717 A1 * | 11/2003 | Yogeshwar | ............... | H04N 5/76 386/328 |
| 2004/0150747 A1 * | 8/2004 | Sita | ..................... | H04N 21/4621 348/558 |
| 2008/0170626 A1 | 7/2008 | Sung | | |
| 2008/0304738 A1 | 12/2008 | Beilloin | | |
| 2009/0174811 A1 | 7/2009 | Sung | | |
| 2011/0216162 A1 * | 9/2011 | Filippini | ................ | H04N 11/02 348/43 |
| 2011/0242112 A1 | 10/2011 | Katayama | | |
| 2011/0310980 A1 | 12/2011 | Mathew | | |
| 2013/0235039 A1 | 9/2013 | Montag | | |
| 2013/0243100 A1 | 9/2013 | Liu | | |
| 2013/0322515 A1 | 12/2013 | Tung | | |
| 2014/0057549 A1 | 2/2014 | Ling | | |
| 2014/0098111 A1 * | 4/2014 | Ju | ........................ | H04N 19/127 345/502 |
| 2014/0247983 A1 * | 9/2014 | MacInnis | ............... | H04N 19/14 382/166 |
| 2015/0156469 A1 * | 6/2015 | Qu | ........................ | H04N 9/8715 348/43 |
| 2017/0070743 A1 * | 3/2017 | Zhou | ..................... | H04N 19/152 |

FOREIGN PATENT DOCUMENTS

| | | |
|---|---|---|
| CN | 101854508 A | 10/2010 |
| CN | 102625106 A | 8/2012 |
| CN | 102665135 A | 9/2012 |
| CN | 102681812 A | 9/2012 |
| CN | 103167281 A | 6/2013 |
| CN | 103347163 A | 10/2013 |
| CN | 103428528 A | 12/2013 |
| EP | 0 517 383 A2 | 12/1992 |
| WO | 2014056406 A1 | 4/2014 |

OTHER PUBLICATIONS

"International Search Report" dated Jul. 31, 2015 for International application No. PCT/CN2015/074433, International filing date:Mar. 18, 2015.

"International Search Report" dated Jun. 17, 2015 for International application No. PCT/CN2015/074432, International filing date:Mar. 18, 2015.

"International Search Report" dated Aug. 5, 2015 for International application No. PCT/CN2015/074430, International filing date:Mar. 18, 2015.

Richard Lawrence, High-Speed Serial Interface for Mobile Displays, DES4-1, IDW'S 06, Proceedings of the 13th International Display Workshops, vol. 3, XP008130948, Dec. 6-8, 2006, Otsu, Japan.

J. Meehan et al., Multimedia IP architecture trends in the mobile multimedia consumer device, Signal Processing: Image Communication, 2010 Elsevier B.V., XP027080310, pp. 317-324, Jun. 1, 2010.

Pierre De Greef et al., P-49: Integrated DisplayPort TCON Device with Vibrant Picture Quality Features, SID 09 Digest, XP007017408, May 31, 2009, pp. 1275-1278.

* cited by examiner

FIG. 8

DATA PROCESSING APPARATUS FOR PERFORMING DISPLAY DATA COMPRESSION/DECOMPRESSION WITH COLOR FORMAT CONVERSION AND RELATED DATA PROCESSING METHOD

CROSS REFERENCE TO RELATED APPLICATIONS

This application claims the benefit of U.S. provisional application No. 61/954,667, filed on Mar. 18, 2014 and incorporated herein by reference.

TECHNICAL FIELD

The disclosed embodiments of the present invention relate to transmitting display data over a display interface, and more particularly, to a data processing apparatus for performing display data compression/decompression with color format conversion and a related data processing method.

BACKGROUND

A display interface is disposed between a first chip and a second chip to transmit display data from the first chip to the second chip for further processing. For example, the first chip may be a host application processor, and the second chip may be a driver integrated circuit (IC). The display data may include image data, video data, graphic data, and/or OSD (on-screen display) data. Besides, the display data may be single view data for two-dimensional (2D) display or multiple view data for three-dimensional (3D) display. When a display panel supports a higher display resolution, 2D/3D display with higher resolution can be realized. Hence, the display data transmitted over the display interface would have a larger data size/data rate, which increases the power consumption of the display interface inevitably. If the host application processor and the driver IC are both located at a portable device (e.g., a smartphone) powered by a battery device, the battery life is shortened due to the increased power consumption of the display interface. Thus, there is a need for an innovative design which can effectively reduce the power consumption of the display interface.

SUMMARY

In accordance with exemplary embodiments of the present invention, a data processing apparatus for performing display data compression/decompression with color format conversion and a related data processing method are proposed.

According to a first aspect of the present invention, an exemplary data processing apparatus is disclosed. The exemplary data processing apparatus includes a compression circuit and an output interface. The compression circuit includes a pre-processor and a compressor. The pre-processor is arranged to receive a first input display data in a first color domain, and perform a color format conversion upon the first input display data to generate a second input display data in a second color domain, wherein the second color domain is different from the first color domain. The compressor is configured to perform compression in the second color domain, wherein the compressor is arranged to compress the second input display data into a compressed display data in the second color domain. The output interface is arranged to pack an output display data derived from the compressed display data into an output bitstream, and output the output bitstream via a display interface.

According to a second aspect of the present invention, an exemplary data processing apparatus is disclosed. The exemplary data processing apparatus includes an input interface and a decompression circuit. The decompression circuit includes a de-compressor and a post-processor. The input interface is arranged to receive an input bitstream from a display interface, and un-pack the input bitstream into an input display data in a first color domain. The de-compressor is configured to perform decompression in the first color domain, wherein the decompression is arranged to de-compress a compressed display data derived from the input display data to generate a first de-compressed display data in the first color domain. The post-processor is arranged to perform a color format conversion upon the first de-compressed display data to generate a second de-compressed display data in a second color domain, wherein the second color domain is different from the first color domain.

According to a third aspect of the present invention, an exemplary data processing method is disclosed. The exemplary data processing method includes: receiving a first input display data in a first color domain; utilizing a pre-processor for performing a color format conversion upon the first input display data to generate a second input display data in a second color domain, wherein the second color domain is different from the first color domain; performing compression in the second color domain, wherein the compression compresses the second input display data into a compressed display data in the second color domain; packing an output display data derived from the compressed display data into an output bitstream; and outputting the output bitstream via a display interface.

According to a fourth aspect of the present invention, an exemplary data processing method is disclosed. The exemplary data processing method includes: receiving an input bitstream from a display interface; un-packing the input bitstream into an input display data in a first color domain; performing decompression in the first color domain, wherein the decompression de-compresses a compressed display data derived from the input display data to generate a first de-compressed display data in the first color domain; and utilizing a post-processor for performing a color format conversion upon the first de-compressed display data to generate a second de-compressed display data in a second color domain, wherein the second color domain is different from the first color domain.

These and other objectives of the present invention will no doubt become obvious to those of ordinary skill in the art after reading the following detailed description of the preferred embodiment that is illustrated in the various figures and drawings.

DETAILED DESCRIPTION

Certain terms are used throughout the description and following claims to refer to particular components. As one skilled in the art will appreciate, manufacturers may refer to a component by different names. This document does not intend to distinguish between components that differ in name but not function. In the following description and in the claims, the terms "include" and "comprise" are used in an open-ended fashion, and thus should be interpreted to mean "include, but not limited to . . . ". Also, the term "couple" is intended to mean either an indirect or direct electrical connection. Accordingly, if one device is coupled to another device, that connection may be through a direct electrical connection, or through an indirect electrical connection via other devices and connections.

The concept of the present invention is to apply data compression upon display data and then transmit compressed display data over a display interface. As the data size/data rate of the compressed display data is smaller than that of the original un-compressed display data, the power consumption of the display interface is reduced correspondingly. The display data compression/decompression may be configured to operate in a color domain that is different from a color domain in which the input display data to be displayed on a display panel is generated. That is, a display panel color type may be incompatible with the color domain in which the display data compression/decompression is performed. For example, the display panel may employ a sub-pixel rendering technique to have an increased resolution. Hence, the display panel may have a particular sub-pixel layout design. For example, a display data fed into a display panel with a particular sub-pixel layout design may be in an RGBG (Red-Green/Blue-Green) color domain, an RGBW (Red-Green-Blue-White) color domain, an RGBY (Red-Green-Blue-Yellow) color domain, an RGBYC (Red-Green-Blue-Yellow-Cyan) color domain, or an ARGB (Alpha-Red-Green-Blue) color domain. However, the display data compression/decompression may be configured to operate in a YUV color domain different from any of RGBG color domain, RGBW color domain, RGBY color domain, RGBYC color domain, and ARGB color domain. Since an uncompressed display data required to undergo display data compression for transmission over the display interface is in a color domain identical to a display panel color domain (e.g., one of RGBG color domain, RGBW color domain, RGBY color domain, RGBYC color domain, and ARGB color domain), the present invention further proposes applying a color format conversion to the uncompressed display data before the uncompressed display data is fed into a compressor designed to operate in a compressor color domain (e.g., YUV color domain). In addition, since a de-compressed display data generated from a de-compressor may be in a de-compressor color domain (e.g., YUV color domain), the present invention further proposes applying a color format conversion to the de-compressed display data before the de-compressed display data is transmitted to a display panel designed to operate in the display panel color domain (e.g., one of RGBG color domain, RGBW color domain, RGBY color domain, RGBYC color domain, and ARGB color domain). Further details of the proposed display data compression/decompression with color format conversion are described as below.

Figure 1:
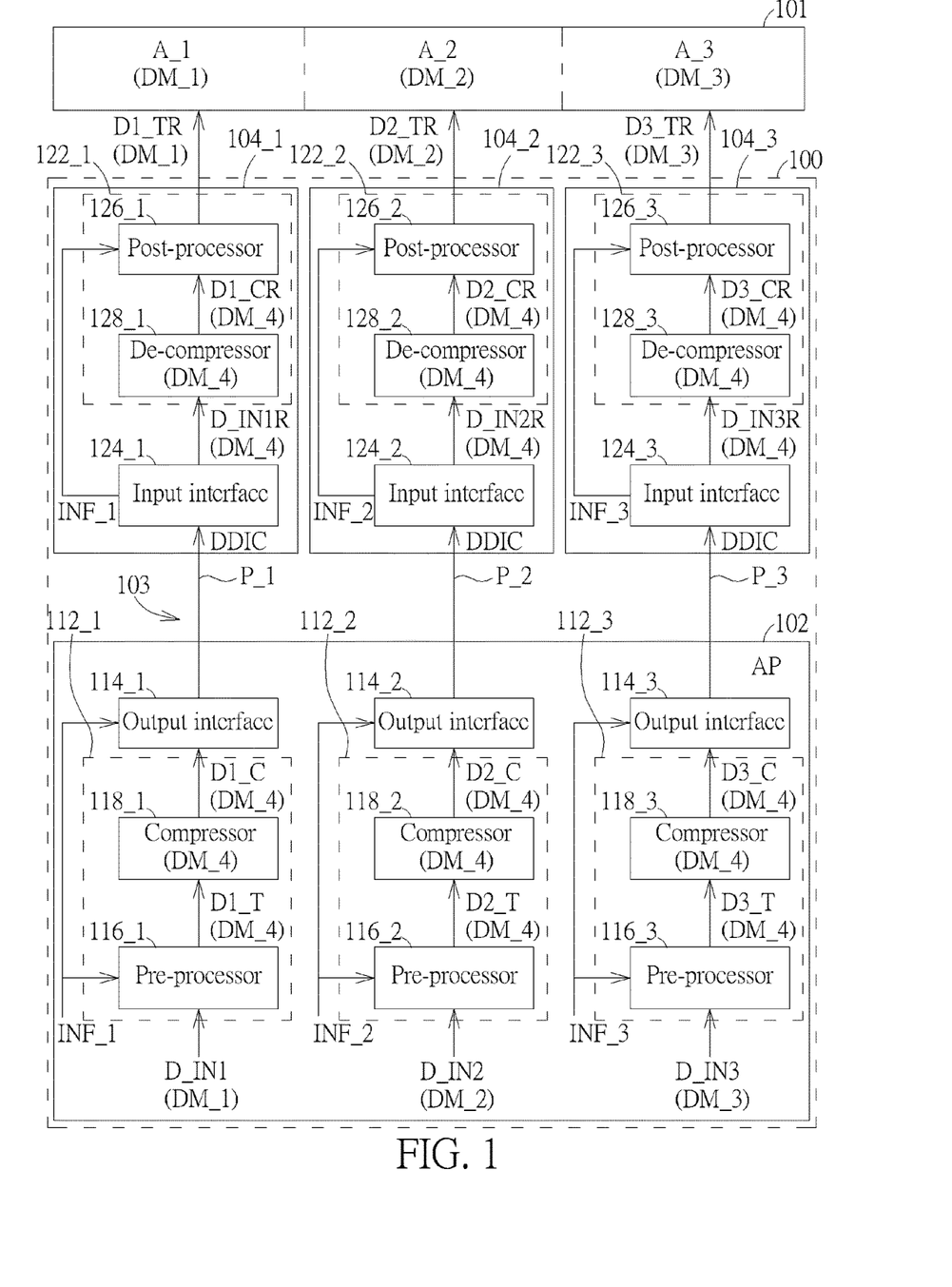
FIG. 1 is a block diagram illustrating a data processing system according to an embodiment of the present invention.

FIG. 1 is a block diagram illustrating a data processing system according to an embodiment of the present invention. The data processing system 100 includes a plurality of data processing apparatuses such as an application processor (AP) 102 and a plurality of display driver integrated circuits (DDICs) 104_1, 104_2, and 104_3. The AP 102 and the DDICs 104 may be implemented in different chips, and the AP 102 communicates with the DDICs 104_1-104_3 via a display interface 103. In this embodiment, the display interface 103 may be a display serial interface (DSI) standardized by a Mobile Industry Processor Interface (MIPI) or an embedded display port (eDP) standardized by a Video Electronics Standards Association (VESA).

Since there are three DDICs implemented in the data processing system 100, the AP 102 is coupled to the DDICs 104_1-104_3 through three display ports P_1, P_2, and P_3 of the display interface 103. The display ports P_1, P_2, and P_3 correspond to partial display regions A_1, A_2, and A_3 of a display panel 101, respectively. More specifically, the DDICs 104_1-104_3 are used to drive the partial display regions A_1-A_3 of the display panel 101, respectively. In addition, the AP 102 may process three partial display data of each frame separately, where the input display data D_IN1 may include one of the three partial display data of each frame, the input display data D_IN2 may include another of the three partial display data of each frame, and the input display data D_IN3 may include the other of the three partial display data of each frame. Each of the input display data D_IN1-D_IN3 may include image data, video data, graphic data, and/or OSD data. Further, each of the input display data D_IN1-D_IN3 may be single view data for 2D display or multiple view data for 3D display.

It should be noted that the configuration shown in FIG. 1 is for illustrative purposes only, and is not meant to be a limitation of the present invention. For example, the number of DDICs and the number of partial display regions driven by different DDICs may be adjusted, depending upon actual design consideration.

The AP 102 includes a plurality of compression circuits 112_1, 112_2, and 112_3, where the compression circuit 112_1 includes a pre-processor 116_1 and a compressor 118_1, the compression circuit 112_2 includes a pre-processor 116_2 and a compressor 118_2, and the compression circuit 112_3 includes a pre-processor 116_3 and a compressor 118_3. The AP 102 further includes a plurality of output interfaces 114_1, 114_2, and 114_3 coupled to the compression circuits 112_1, 112_2, and 112_3, respectively. In this embodiment, the partial display regions A_1-A_3 of the display panel 101 have different display panel color types. Hence, display data inputs for driving partial display regions A_1-A_3 of the display panel 101 are in different color domains DM_1, DM_2, and DM_3, respectively. For example, the color domain DM_1 may be an RGB color domain, the color domain DM_2 may be a BGGR color domain, and the color domain DM_3 may be a YUV color domain. Further, the input display data D_IN1 is intended to be displayed on the partial display region A_1, the input display data D_IN2 is intended to be displayed on the partial display region A_2, and the input display data D_IN3 is intended to be displayed on the partial display region A_3. Hence, the input display data D_IN1 is in the color domain DM_1, the input display data D_IN2 is in the color domain DM_2, and the input display data D_IN3 is in the color domain DM_3.

In this embodiment, the compressors 118_1, 118_2 and 118_3 are configured to perform compression in a color domain DM_4. The pre-processor 116_1 receives indication information INF_1 indicative of the color domain DM_1 to which the input display data D_IN1 corresponds, and refers to the indication information INF_1 to determine whether the color domain DM_1 is different from the color domain DM_4. When the color domain DM_1 is different from the color domain DM_4, the pre-processor 116_1 receives the input display data D_IN1 in the color domain DM_1, and performs a color format conversion upon the input display data D_IN1 to generate an input display data D1_T in the color domain DM_4. However, when the color domain DM_1 is identical to the color domain DM_4, the pre-processor 116_1 bypasses the input display data D_IN1 without performing any color format conversion upon the input display data D_IN1, and therefore outputs the input display data D_IN1 as the input display data D1_T (i.e., D1_T=D_IN1).

Similarly, the pre-processor 116_2 receives indication information INF_2 indicative of the color domain DM_2 to which the input display data D_IN2 corresponds, and refers to the indication information INF_2 to determine whether the color domain DM_2 is different from the color domain DM_4. When the color domain DM_2 is different from the color domain DM_4, the pre-processor 116_2 receives the input display data D_IN2 in the color domain DM_2, and performs a color format conversion upon the input display data D_IN2 to generate an input display data D2_T in the color domain DM_4. However, when the color domain DM_2 is identical to the color domain DM_4, the pre-processor 116_2 bypasses the input display data D_IN2 without performing any color format conversion upon the input display data D_IN2, and therefore outputs the input display data D_IN2 as the input display data D2_T (i.e., D2_T=D_IN2).

The pre-processor 116_3 receives indication information INF_3 indicative of the color domain DM_3 to which the input display data D_IN3 corresponds, and refers to the indication information INF_3 to determine whether the color domain DM_3 is different from the color domain DM_4. When the color domain DM_3 is different from the color domain DM_4, the pre-processor 116_3 receives the input display data D_IN3 in the color domain DM_3, and performs a color format conversion upon the input display data D_IN3 to generate an input display data D3_T in the color domain DM_4. However, when the color domain DM_3 is identical to the color domain DM_4, the pre-processor 116_3 bypasses the input display data D_IN3 without performing any color format conversion upon the input display data D_IN3, and therefore outputs the input display data D_IN3 as the input display data D3_T (i.e., D3_T=D_IN3).

As mentioned above, the display ports P_1-P_3 of the display interface 103 correspond to the partial display regions A_1-A_3 in different color domains, respectively. Hence, the color format conversion performed by each of pre-processors 116_1-116_3 is display-port dependent. For example, the pre-processors 116_1-116_3 located at signal paths associated with different display ports P_1-P_3 of the display interface 103 may perform different color format conversions, respectively.

Figure 2:
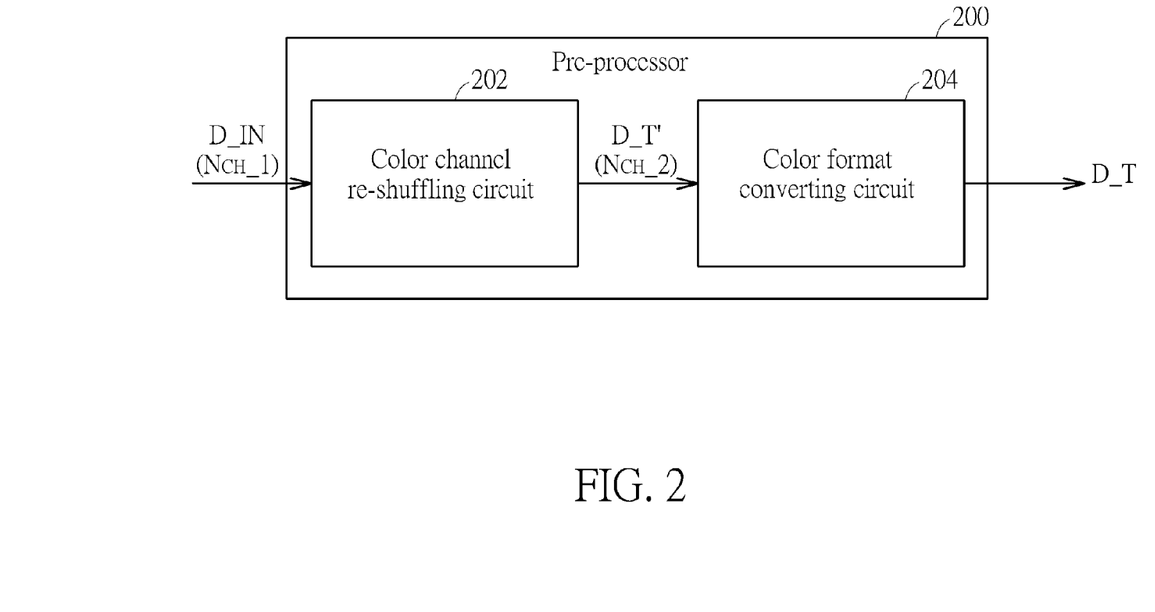
FIG. 2 is a diagram illustrating a pre-processor according to an embodiment of the present invention.

Each of the pre-processor 116_1-116_3 may be further configured to support a color channel re-shuffling function. FIG. 2 is a diagram illustrating a pre-processor according to an embodiment of the present invention. In one exemplary design, each of the pre-processor 116_1-116_3 shown in FIG. 1 may be implemented using the pre-processor 200 shown in FIG. 2. In this embodiment, the pre-processor 200 includes a color channel re-shuffling circuit 202 and a color format converting circuit 204. The pre-processor 200 is configured to perform a color format conversion upon a first input display data D_IN in a first color domain to generate a second input display data D_T in a second color domain, where the second color domain is different from the first color domain. With regard to the color channel re-shuffling circuit 202 of the pre-processor 202, it is configured to convert the first input display data D_IN in the first color domain into a third input display data D_T' in a third color domain through re-shuffling at least one color channel of the first input display data D_IN to different color channels of the third input display data D_T', where the third color domain is different from the first color domain and the second color domain, and the color channel number NCH_2 of the third input display data D_T' in the third color domain is different from the color channel number NCH_1 of the first input display data D_IN in the first color domain. With regard to the color format converting circuit 204 of the pre-processor 200, it is configured to receive the third input display data D_T' generated from the preceding color channel re-shuffling circuit 202, and convert the third input display data D_T' in the third color domain into the second color domain D_T in the second color domain.

Figure 3:
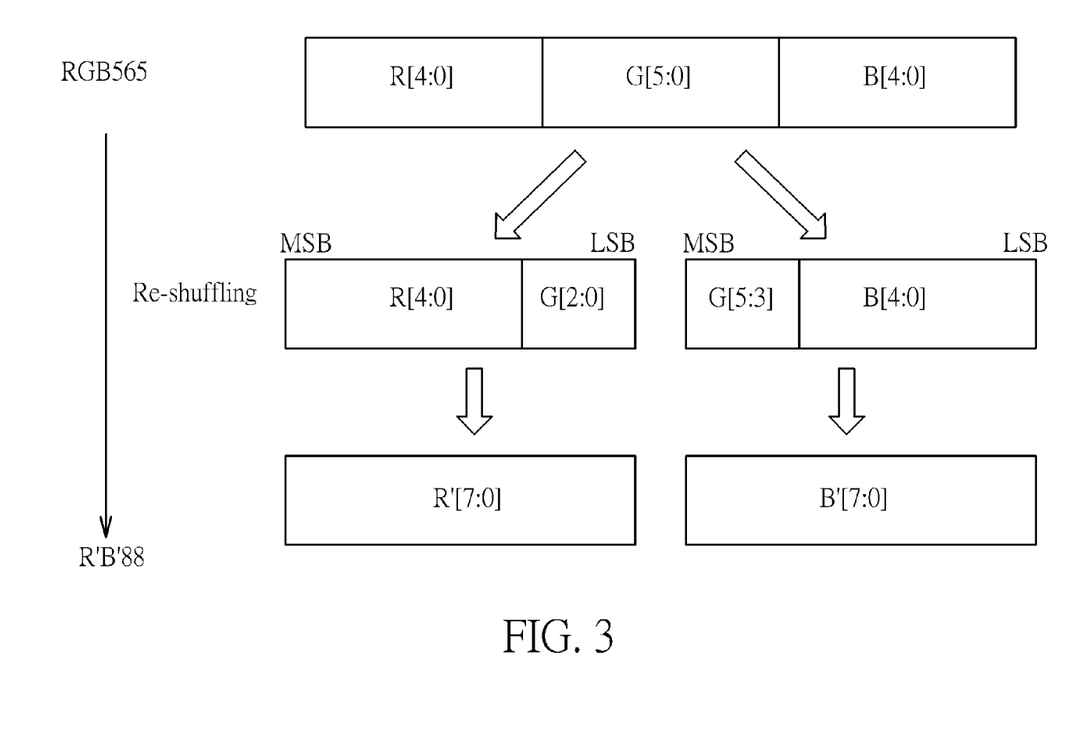
FIG. 3 is a diagram illustrating an example of a color channel re-shuffling function performed by a color channel re-shuffling circuit shown in FIG. 2.

FIG. 3 is a diagram illustrating an example of the color channel re-shuffling function performed by the color channel re-shuffling circuit 202 shown in FIG. 2. In this example, the first input display data D_IN received by the color channel re-shuffling circuit 202 is in the RGB565 color domain, and the third input display data D_T' generated from the color channel re-shuffling circuit 202 is in the R'B'88 color format. Hence, the first input display data D_IN has three color channels R, G, and B, where the pixel data in the R channel has 5 bits R[4:0], the pixel data in the G channel has 6 bits G[5:0], and the pixel data in the B channel has 5 bits B[4:0]. Concerning the third input display data D_T', it has two color channels R' and B', where the pixel data in the R' channel has 8 bits R'[7:0], and the pixel data in the B' channel has 8 bits B'[7:0]. As shown in FIG. 3, the pixel data G[5:0] in the G channel is split and re-shuffled to the R' channel and the B' channel. In this example, a least significant bit (LSB) part G[2:0] of the pixel data G[5:0] is re-shuffled to the R' channel to act as an LSB part of the pixel data R'[7:0] in the R' channel, and a most significant bit (MSB) part G[5:3] of the pixel data G[5:0] is re-shuffled to the B' channel to act as an MSB part of the pixel data B'[7:0] in the B' channel. In addition, the pixel data R[4:0] in the R channel is used as an MSB part of the pixel data R'[7:0] in the R' channel, and the pixel data B[4:0] in the B channel is used as an LSB part of the pixel data B'[7:0] in the B' channel. Compared to MSB parts of pixels in a color channel, LSB parts of the pixels in the color channel may have a more significant pixel data variation. Hence, data compression of the third input display data D_T' can benefit from re-shuffling the LSB part G[2:0] of the pixel data G[5:0] to the R' channel to serve as an LSB part of the R' channel and re-shuffling the MSB part G[5:3] of the pixel data G[5:0] to the B' channel to serve as an MSB part of the B' channel. However, this is for illustrative purposes only, and is not meant to be a limitation of the present invention.

As mentioned above, the color format converting circuit 204 converts the third input display data D_T' in the third color domain into the second color domain D_T in the desired second color domain. Consider a case where the third color domain is the R'B'88 color format, and the desired second color domain is the YUV color domain. In one exemplary design, the color format converting circuit 204 may duplicate one of the pixel data R'[7:0] and B'[7:0] to act as the pixel data G'[7:0] of a G' channel (i.e., G'[7:0]=R'[7:0] or G'[7:0]=B'[7:0]), and then generate the second input display data D_T based on the pixel data R'[7:0], G'[7:0] and B'[7:0]. However, this is for illustrative purposes only, and is not meant to be a limitation of the present invention.

Please refer to FIG. 1 again. The compressor 118_1 is arranged to compress the input display data D1_T in the color domain DM_4 into a compressed display data D1_C in the same color domain DM_4. The compressor 118_2 is arranged to compress the input display data D2_T in the color domain DM_4 into a compressed display data D2_C in the same color domain DM_4. The compressor 118_3 is arranged to compress the input display data D3_T in the color domain DM_4 into a compressed display data D3_C in the same color domain DM_4.

The output interface 114_1 is coupled to the display port P_1 of the display interface 103, and is arranged to pack an output display data derived from the compressed display data D1_C into an output bitstream and then output the output bitstream to the DDIC 104_1 via the display port P_1 of the display interface 103. In addition, the output interface 114_1 further receives the indication information INF_1, and records the indication information INF_1 in the output bitstream transmitted to the DDIC 104_1. Hence, the indication information INF_1 is transmitted from the AP 102 to the DDIC 104_1 for informing the DDIC 104_1 of the color domain DM_1 to which the input display data D_IN1 corresponds.

The output interface 114_2 is coupled to the display port P_2 of the display interface 103, and is arranged to pack an output display data derived from the compressed display data D2_C into an output bitstream and then output the output bitstream to the DDIC 104_2 via the display port P_2 of the display interface 103. In addition, the output interface 114_2 further receives the indication information INF_2, and records the indication information INF_2 in the output bitstream transmitted to the DDIC 104_2. Hence, the indication information INF_2 is transmitted from the AP 102 to the DDIC 104_2 for informing the DDIC 104_2 of the color domain DM_2 to which the input display data D_IN2 corresponds.

The output interface 114_3 is coupled to the display port P_3 of the display interface 103, and is arranged to pack an output display data derived from the compressed display data D3_C into an output bitstream and then output the output bitstream to the DDIC 104_3 via the display port P_3 of the display interface 103. In addition, the output interface 114_3 further receives the indication information INF_3, and records the indication information INF_3 in the output bitstream transmitted to the DDIC 104_3. Hence, the indication information INF_3 is transmitted from the AP 102 to the DDIC 104_3 for informing the DDIC 104_3 of the color domain DM_3 to which the input display data D_IN3 corresponds.

It should be noted that, concerning the AP 102, only the circuit components pertinent to the proposed display data compression with color format conversion are shown in FIG. 1. In practice, the AP 102 may have additional circuit components to achieve other functions.

After a compressed display data is transmitted over one display port of the display interface 103, a DDIC is used to drive a partial display region of the display panel 101 according to the compressed display data (particularly, a de-compressed display data derived from applying decompression to the compressed display data). In this embodiment, the DDIC 104_1 includes a decompression circuit 122_1 and an input interface 124_1, where the decompression circuit 122_1 includes a post-processor 126_1 and a de-compressor 128_1; the DDIC 104_2 includes a decompression circuit 122_2 and an input interface 124_2, where the decompression circuit 122_2 includes a post-processor 126_2 and a de-compressor 128_2; and the DDIC 104_3 includes a decompression circuit 122_3 and an input interface 124_3, where the decompression circuit 122_3 includes a post-processor 126_3 and a de-compressor 128_3. The DDIC 104_1 is used to drive the partial display region A_1 according to a de-compressed display data obtained by applying decompression to a compressed display data transmitted from the display port P_1 of the AP 102. The DDIC 104_2 is used to drive the partial display region A_2 according to a de-compressed display data obtained by applying decompression to a compressed display data transmitted from the display port P_2 of the AP 102. The DDIC 104_3 is used to drive the partial display region A_3 according to a de-compressed display data obtained by applying decompression to a compressed display data transmitted from the display port P_3 of the AP 102.

With regard to the DDIC 104_1, the input interface 124_1 receives an input bitstream from the display port P_1 of the display interface 103, and un-packs the input bitstream into an input display data (e.g., a compressed display data D_IN1R) in the color domain DM_4. In addition, the input interface 124_1 parses the indication information INF_1 (which is indicative of the color domain DM_1) from the input bitstream, and provides the indication information INF_1 to the post-processor 126_1. The de-compressor 128_1 is configured to perform decompression in the color domain DM_4. Hence, the de-compressor 128_1 de-compresses the compressed display data D_IN1R derived from the input display data generated by the input interface 124_1, and generates a de-compressed display data D1_CR in the color domain DM_4. The post-processor 126_1 refers to the indication signal INF_1 to determine a color domain to which the input display data D_IN1 corresponds (i.e., a color domain to which the partial display region A_1 corresponds). Hence, when the color domain DM_4 in which the de-compressor 128_1 is configured to operate is different from the color domain DM_1, the post-processor 126_1 performs a color format conversion upon the de-compressed display data D1_CR in the color domain DM_4, and generates a de-compressed display D1_TR in the color domain DM_1 for driving the partial display region A_1. However, when the color domain DM_4 in which the de-compressor 128_1 is configured to operate is identical to the color domain DM_1, the post-processor 126_1 bypasses the de-compressed display data D1_CR without performing any color format conversion upon the de-compressed display data D1_CR, and therefore outputs the de-compressed display data D1_CR as the de-compressed display data D1_TR (i.e., D1_TR=D1_CR).

With regard to the DDIC 104_2, the input interface 124_2 receives an input bitstream from the display port P_2 of the display interface 103, and un-packs the input bitstream into an input display data (e.g., a compressed display data D_IN2R) in the color domain DM_4. In addition, the input interface 124_2 parses the indication information INF_2 (which is indicative of the color domain DM_2) from the input bitstream, and provides the indication information INF_2 to the post-processor 126_2. The de-compressor 128_2 is configured to perform decompression in the color domain DM_4. Hence, the de-compressor 128_2 de-compresses the compressed display data D_IN2R derived from the input display data generated by the input interface 124_2, and generates a de-compressed display data D2_CR in the color domain DM_4. The post-processor 126_2 refers to the indication signal INF_2 to determine a color domain to which the input display data D_IN2 corresponds (i.e., a color domain to which the partial display region A_2 corresponds). Hence, when the color domain DM_4 in which the de-compressor 128_2 is configured to operate is different from the color domain DM_2, the post-processor 126_2 performs a color format conversion upon the de-compressed display data D2_CR in the color domain DM_4, and generates a de-compressed display D2_TR in the color domain DM_2 for driving the partial display region A_2. However, when the color domain DM_4 in which the de-compressor 128_2 is configured to operate is identical to the color domain DM_2, the post-processor 126_2 bypasses the de-compressed display data D2_CR without performing any color format conversion upon the de-compressed display data D2_CR, and therefore outputs the de-compressed display data D2_CR as the de-compressed display data D2_TR (i.e., D2_TR=D2_CR).

With regard to the DDIC 104_3, the input interface 124_3 receives an input bitstream from the display port P_3 of the display interface 103, and un-packs the input bitstream into an input display data (e.g., a compressed display data D_IN3R) in the color domain DM_4. In addition, the input interface 124_3 parses the indication information INF_3 (which is indicative of the color domain DM_3) from the input bitstream, and provides the indication information INF_3 to the post-processor 126_3. The de-compressor 128_3 is configured to perform decompression in the color domain DM_4. Hence, the de-compressor 128_3 de-compresses the compressed display data D_IN3R derived from the input display data generated by the input interface 124_3, and generates a de-compressed display data D3_CR in the color domain DM_4. The post-processor 126_3 refers to the indication signal INF_3 to determine a color domain to which the input display data D_IN3 corresponds (i.e., a color domain to which the partial display region A_3 corresponds). Hence, when the color domain DM_4 in which the de-compressor 128_3 is configured to operate is different from the color domain DM_3, the post-processor 126_3 performs a color format conversion upon the de-compressed display data D3_CR in the color domain DM_4, and generates a de-compressed display D3_TR in the color domain DM_3 for driving the partial display region A_3. However, when the color domain DM_4 in which the de-compressor 128_3 is configured to operate is identical to the color domain DM_3, the post-processor 126_3 bypasses the de-compressed display data D3_CR without performing any color format conversion upon the de-compressed display data D3_CR, and therefore outputs the de-compressed display data D3_CR as the de-compressed display data D3_TR (i.e., D3_TR=D3_CR).

It should be noted that, concerning each of the DDICs 104_1-104_3, only the circuit components pertinent to the proposed display data decompression with color format conversion are shown in FIG. 1. In practice, each of the DDICs 104_1-104_3 may have additional circuit components to achieve other functions.

Figure 4:
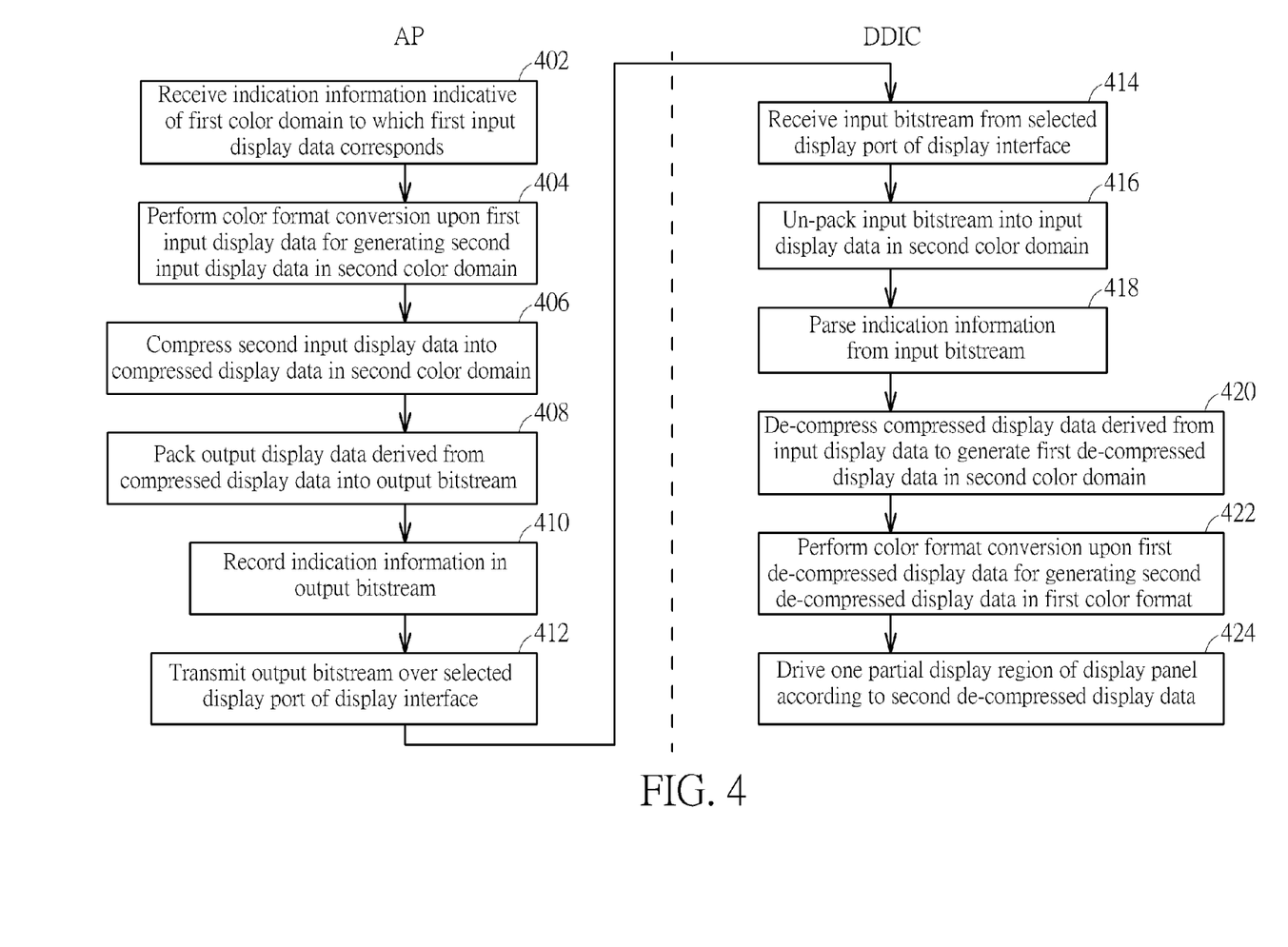
FIG. 4 is a flowchart illustrating a data processing method according to an embodiment of the present invention.

FIG. 4 is a flowchart illustrating a data processing method according to an embodiment of the present invention. Provided that the result is substantially the same, the steps are not required to be executed in the exact order shown in FIG. 4. The data processing method may be employed by the data processing system 100 shown in FIG. 1, and may be briefly summarized as below.

Step 402: Receive indication information indicative of a first color domain to which a first input display data corresponds, where the first input display data is to be displayed on one partial display region of a display panel.

Step 404: Refer to the indication information to perform a color format conversion upon the first input display data for generating a second input display data in a second color domain, where the second color domain is different from the first color domain.

Step 406: Compress the second input display data into a compressed display data in the second color domain.

Step 408: Pack an output display data derived from the compressed display data into an output bitstream.

Step 410: Record the indication information in the output bitstream.

Step 412: Transmit the output bitstream over a selected display port of a display interface.

Step 414: Receive an input bitstream from the selected display port of the display interface.

Step 416: Un-pack the input bitstream into an input display data in the second color domain.

Step 418: Parse the indication information from the input bitstream.

Step 420: De-compress a compressed display data derived from the input display data to generate a first de-compressed display data in the second color domain.

Step 422: Refer to the indication information to perform a color format conversion upon the first de-compressed display data for generating a second de-compressed display data in the first color format.

Step 424: Drive one partial display region of the display panel according to the second de-compressed display data.

Steps 402-412 are performed at the AP side (i.e., the encoder side), and steps 414-424 are performed at the DDIC side (i.e., the decoder side). As a person skilled in the art can readily understand details of each step shown in FIG. 4 after reading above paragraphs, further description is omitted here for brevity.

Figure 5:
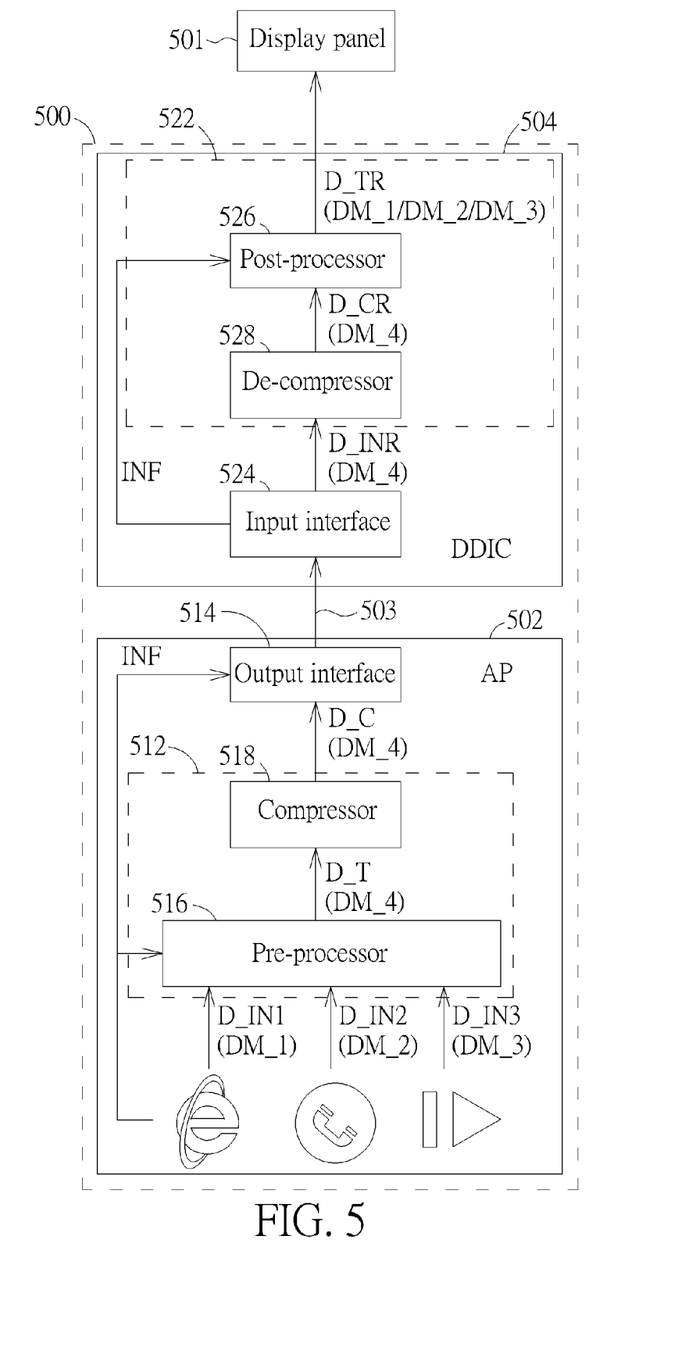
FIG. 5 is a block diagram illustrating another data processing system according to an embodiment of the present invention.

FIG. 5 is a block diagram illustrating another data processing system according to an embodiment of the present invention. The data processing system 500 includes a plurality of data processing apparatuses such as an application processor (AP) 502 and a display driver integrated circuit (DDIC) 504. The AP 502 and the DDIC 504 may be implemented in different chips, and the AP 502 communicates with the DDIC 504 via a display interface 503. In this embodiment, the display interface 503 may be a display serial interface (DSI) standardized by a Mobile Industry Processor Interface (MIPI) or an embedded display port (eDP) standardized by a Video Electronics Standards Association (VESA).

The AP 502 is used to process an input display data and generate a compressed display data, where the input display data may be generated in one of a plurality of user operation scenarios. For example, the user operation scenarios may include web-browsing, phone call, video playback, etc. When a user uses an electronic device (e.g., a mobile phone) having the display panel 501 and the proposed data processing system 500 implemented therein to perform a web-browsing function, an input display data D_IN1 in a color domain DM_1 is generated to the AP 502. When the user uses the electronic device (e.g., mobile phone) having the display panel 501 and the proposed data processing system 500 implemented therein to communicate with a contact person through a phone call function, an input display data D_IN2 in a color domain DM_2 is generated to the AP 502. When the user uses the electronic device (e.g., mobile phone) having the display panel 501 and the proposed data processing system 500 implemented therein to perform a video playback function, an input display data D_IN3 in a color domain DM_3 is generated to the AP 502. The input display data received by the AP 502 may include image data, video data, graphic data, and/or OSD data. Further, each of the input display data D_IN1-D_IN3 may be single view data for 2D display or multiple view data for 3D display.

It should be noted that the configuration shown in FIG. 5 is for illustrative purposes only, and is not meant to be a limitation of the present invention. For example, the number of input display data generated in different user operational scenarios and supported by the AP 502 may be adjusted, depending upon actual design consideration.

In this embodiment, the AP 502 includes a compression circuit 512 and an output interface 514, where the compression circuit 512 includes a pre-processor 516 and a compressor 518. The input display data DIN_1, DIN_2, D_IN3 generated in different user operation scenarios may be in different color domains DM_1, DM_2, DM_3, respectively. For example, the color domain DM_1 may be a YUV888 color domain, the color domain DM_2 may be an RGB565 color domain, and the color domain DM_3 may be an ARGB color domain.

In this embodiment, the compressor 518 is configured to perform compression in a color domain DM_4. The pre-processor 516 receives indication information INF indicative of a color domain (e.g., one of DM_1, DM_2 and DM_3) to which a current input display data (e.g., one of D_IN1, D_IN2 and D_IN3) corresponds, and refers to the indication information INF to determine whether the color domain of the current input display data is different from the color domain DM_4. Consider a first case where the current input display data is D_IN1. When the color domain DM_1 is different from the color domain DM_4, the pre-processor 516 performs a color format conversion upon the input display data D_IN1 in the color domain DM_1 to generate an input display data D_T in the color domain DM_4. However, when the color domain DM_1 is identical to the color domain DM_4, the pre-processor 516 bypasses the input display data D_IN1 without performing any color format conversion upon the input display data D_IN1, and therefore outputs the input display data D_IN1 as the input display data D_T (i.e., D_T=D_IN1).

Consider a second case where the current input display data is D_IN2. When the color domain DM_2 is different from the color domain DM_4, the pre-processor 516 performs a color format conversion upon the input display data D_IN2 in the color domain DM_2 to generate an input display data D_T in the color domain DM_4. However, when the color domain DM_2 is identical to the color domain DM_4, the pre-processor 516 bypasses the input display data D_IN2 without performing any color format conversion upon the input display data D_IN2, and therefore outputs the input display data D_IN2 as the input display data D_T (i.e., D_T=D_IN2).

Consider a third case where the current input display data is D_IN3. When the color domain DM_3 is different from the color domain DM_4, the pre-processor 516 performs a color format conversion upon the input display data D_IN3 in the color domain DM_3 to generate an input display data D_T in the color domain DM_4. However, when the color domain DM_3 is identical to the color domain DM_4, the pre-processor 516 bypasses the input display data D_IN3 without performing any color format conversion upon the input display data D_IN3, and therefore outputs the input display data D_IN3 as the input display data D_T (i.e., D_T=D_IN3).

As mentioned above, different user operation scenarios correspond to input display data D_IN1-D_IN3 in different color domains, respectively. Hence, the color format conversion performed by the pre-processor 516 is user-operation-scenario dependent. For example, the pre-processor 516 may perform different color format conversions for different user operation scenarios, respectively.

It should be noted that the pre-processor 516 may be further configured to support a color channel re-shuffling function. For example, the pre-processor 516 may be implemented using the pre-processor 200 shown in FIG. 2. As details of the color channel re-shuffling function have been described in above paragraphs, further description is omitted here for brevity.

The compressor 518 is arranged to compress the input display data D_T in the color domain DM_4 into a compressed display data D_C in the same color domain DM_4. The output interface 514 is coupled to the display interface 503, and is arranged to pack an output display data derived from the compressed display data D_C into an output bitstream and then output the output bitstream to the DDIC 504 via the display interface 503. In addition, the output interface 514 further receives the indication information INF, and records the indication information INF in the output bitstream transmitted to the DDIC 504. Hence, the indication information INF is transmitted from the AP 502 to the DDIC 504 for informing the DDIC 504 of a color domain (e.g., one of DM_1, DM_2 and DM_3) to which a current input display data (e.g., one of D_IN1, D_IN2 and D_IN3) corresponds.

It should be noted that, concerning the AP 502, only the circuit components pertinent to the proposed display data compression with color format conversion are shown in FIG. 5. In practice, the AP 502 may have additional circuit components to achieve other functions.

As shown in FIG. 5, the DDIC 504 includes a decompression circuit 522 and an input interface 524, where the decompression circuit 522 includes a post-processor 526 and a de-compressor 528. The DDIC 504 is used to drive the display panel 501 according to a de-compressed display data obtained from applying decompression to a compressed display data transmitted from the AP 502. Hence, the input interface 524 receives an input bitstream from the display interface 503, and un-packs the input bitstream into an input display data (e.g., a compressed display data D_INR) in the color domain DM_4. In addition, the input interface 524 parses the indication information INF (which is indicative of a color domain such as one of DM_1, DM_2 and DM_3) from the input bitstream, and provides the indication information INF to the post-processor 526. The de-compressor 528 is configured to perform decompression in the color domain DM_4. Hence, the de-compressor 528 de-compresses the compressed display data D_INR derived from the input display data generated by the input interface 524, and generates a de-compressed display data D_CR in the color domain DM_4. The post-processor 526 refers to the indication signal INF to determine a color domain to which an input display data at the AP side corresponds. Hence, when the color domain DM_4 in which the de-compressor 528 is configured to operate is different from the color domain indicated by the indication information INF, the post-processor 526 performs a color format conversion upon the de-compressed display data D_CR in the color domain DM_4, and generates a de-compressed display D_TR in a desired color domain (e.g., one of DM_1, DM_2 and DM_3) for driving the display panel 501. However, when the color domain DM_4 in which the de-compressor 528 is configured to operate is identical to the color domain indicated by the indication information INF, the post-processor 526 bypasses the de-compressed display data D_CR without performing any color format conversion upon the de-compressed display data D_CR, and therefore outputs the de-compressed display data D_CR as the de-compressed display data D_TR (i.e., D_TR=D_CR).

It should be noted that, concerning the DDIC 504, only the circuit components pertinent to the proposed display data decompression with color format conversion are shown in FIG. 5. In practice, the DDIC 504 may have additional circuit components to achieve other functions.

Figure 6:
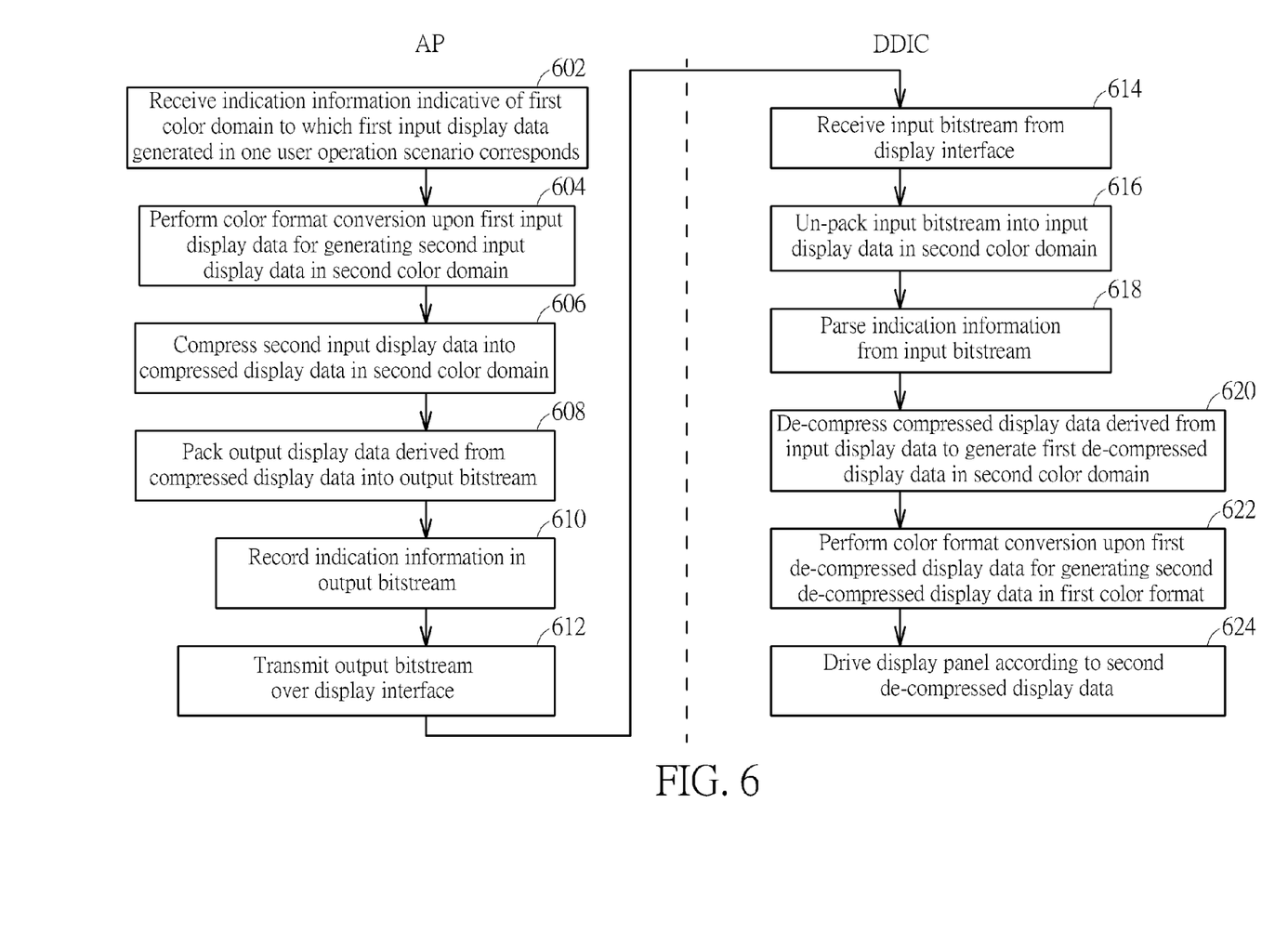
FIG. 6 is a flowchart illustrating another data processing method according to an embodiment of the present invention.

FIG. 6 is a flowchart illustrating another data processing method according to an embodiment of the present invention. Provided that the result is substantially the same, the steps are not required to be executed in the exact order shown in FIG. 6. The data processing method may be employed by the data processing system 500 shown in FIG. 5, and may be briefly summarized as below.

Step 602: Receive indication information indicative of a first color domain to which a first input display data generated in one user operation scenario corresponds.

Step 604: Refer to the indication information to perform a color format conversion upon the first input display data for generating a second input display data in a second color domain, where the second color domain is different from the first color domain.

Step 606: Compress the second input display data into a compressed display data in the second color domain.

Step 608: Pack an output display data derived from the compressed display data into an output bitstream.

Step 610: Record the indication information in the output bitstream.

Step 612: Transmit the output bitstream over a display interface.

Step 614: Receive an input bitstream from the display interface.

Step 616: Un-pack the input bitstream into an input display data in the second color domain.

Step 618: Parse the indication information from the input bitstream.

Step 620: De-compress a compressed display data derived from the input display data to generate a first de-compressed display data in the second color domain.

Step 622: Refer to the indication information to perform a color format conversion upon the first de-compressed display data for generating a second de-compressed display data in the first color format.

Step 624: Drive a display panel according to the second de-compressed display data.

Steps 602-612 are performed at the AP side (i.e., the encoder side), and steps 614-624 are performed at the DDIC side (i.e., the decoder side). As a person skilled in the art can readily understand details of each step shown in FIG. 6 after reading above paragraphs, further description is omitted here for brevity.

Figure 7:
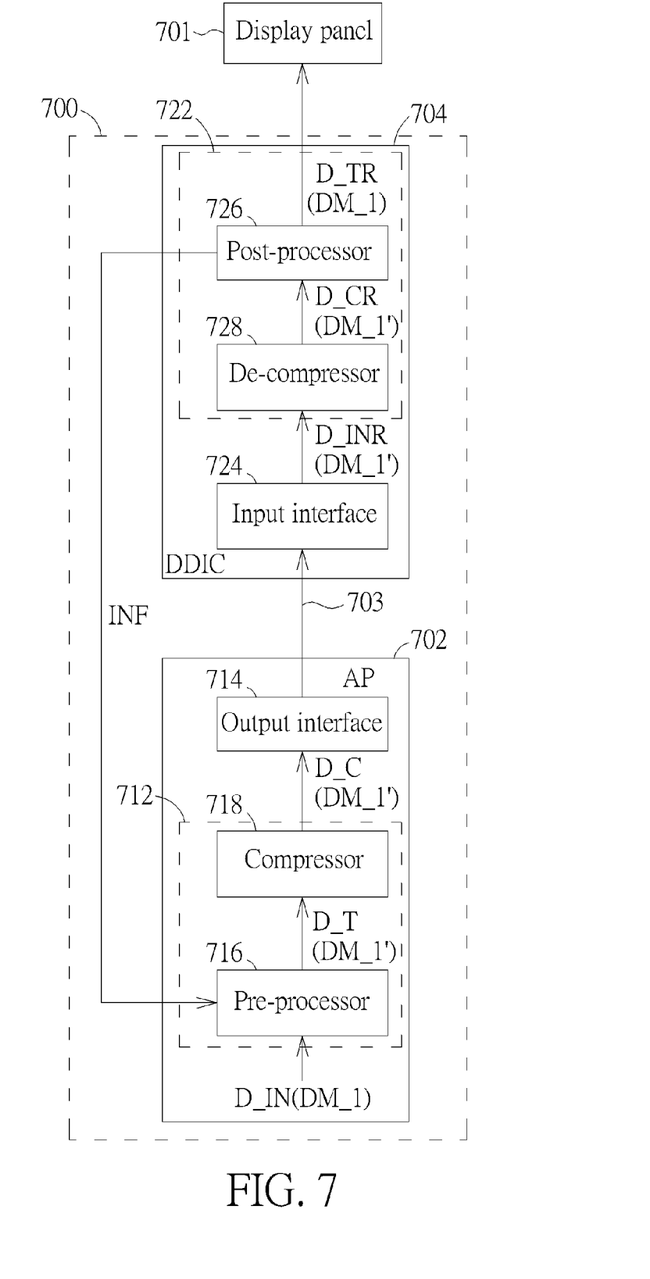
FIG. 7 is a block diagram illustrating yet another data processing system according to an embodiment of the present invention.

FIG. 7 is a block diagram illustrating yet another data processing system according to an embodiment of the present invention. The data processing system 700 includes a plurality of data processing apparatuses such as an application processor (AP) 702 and a display driver integrated circuit (DDIC) 704. The AP 702 and the DDIC 704 may be implemented in different chips, and the AP 702 communicates with the DDIC 704 via a display interface 703. In this embodiment, the display interface 703 may be a display serial interface (DSI) standardized by a Mobile Industry Processor Interface (MIPI) or an embedded display port (eDP) standardized by a Video Electronics Standards Association (VESA).

The AP 702 is used to process an input display data and generate a compressed display data, where the input display data may be generated according to the display driver output capability supported by the DDIC 704. For example, the DDIC 704 shown in FIG. 7 may be configured to support a display output in a designated color domain (e.g., RGB color domain), while another DDIC (not shown) may be configured to support a display output in a different designated color domain (e.g., YUV color domain). In other words, a display panel 701 driven by the DDIC 704 shown in FIG. 7 may support display data reception in the designated color domain (e.g., RGB color domain), while a display panel driven by another DDIC (not shown) may support display data reception in a different color domain (e.g., YUV color domain). Hence, the input display data to be displayed on display panels driven by different DDICs with different display driver output capabilities are in different color domains. For example, an input display data D_IN to be displayed on the display panel 701 is in the designated color domain (e.g., RGB color domain) supported by the DDIC 704 as well as the display panel 701. The input display data D_IN received by the AP 702 may include image data, video data, graphic data, and/or OSD data. Further, the input display data D_IN may be single view data for 2D display or multiple view data for 3D display.

The AP 702 includes a compression circuit 712 and an output interface 714, where the compression circuit 712 includes a pre-processor 716 and a compressor 718. The input display data D_IN is in a color domain DM_1 compliant with the display driver output capability of the DDIC 704. In this embodiment, the compressor 718 is configured to perform compression in a color domain DM_1'. The pre-processor 716 receives indication information INF from the DDIC 704, where the indication information INF is indicative of the color domain DM_1 compliant with the display driver output capability of the DDIC 704. Hence, the pre-processor 716 refers to the indication information INF to determine whether the color domain DM_1 is different from the color domain DM_1'. When the color domain DM_1 is different from the color domain DM_1', the pre-processor 716 performs a color format conversion upon the input display data D_IN in the color domain DM_1 to generate an input display data D_T in the color domain DM_1'. However, when the color domain DM_1 is identical to the color domain DM_1', the pre-processor 716 bypasses the input display data D_IN without performing any color format conversion upon the input display data D_IN, and therefore outputs the input display data D_IN as the input display data D_T (i.e., D_T=D_IN).

As mentioned above, different DDICs may have different display driver output capabilities for driving display panels, respectively. Hence, the color format conversion performed by the pre-processor 716 is display-driver-output-capability dependent. For example, when the AP 702 is used for providing display data to a first DDIC with a first display driver output capability, the pre-processor 716 in the AP 702 may perform a first color format conversion; and when the AP 702 is used for providing display data to a second DDIC with a second display driver output capability different from the first display driver output capability, the pre-processor 716 in the AP 702 may perform a second color format conversion different from the first color format conversion.

It should be noted that the pre-processor 716 may be further configured to support a color channel re-shuffling function. For example, the pre-processor 716 may be implemented using the pre-processor 200 shown in FIG. 2. As details of the color channel re-shuffling function have been described in above paragraphs, further description is omitted here for brevity.

The compressor 718 is arranged to compress the input display data D_T in the color domain DM_1' into a compressed display data D_C in the same color domain DM_1'. The output interface 714 is coupled to the display interface 703, and is arranged to pack an output display data derived from the compressed display data D_C into an output bitstream and then output the output bitstream to the DDIC 704 via the display interface 703.

It should be noted that, concerning the AP 702, only the circuit components pertinent to the proposed display data compression with color format conversion are shown in FIG. 7. In practice, the AP 702 may have additional circuit components to achieve other functions.

In this embodiment, the DDIC 704 supports a designated display driver output capability, and includes a decompression circuit 722 and an input interface 724, where the decompression circuit 722 includes a post-processor 726 and a de-compressor 728. The DDIC 704 is used to drive the display panel 701 according to a de-compressed display data obtained by applying decompression to a compressed display data transmitted from the AP 702. Hence, the input interface 724 receives an input bitstream from the display interface 703, and un-packs the input bitstream into an input display data (e.g., a compressed display data D_INR) in the color domain DM_1'. The de-compressor 728 is configured to perform decompression in the color domain DM_1'. Hence, the de-compressor 728 de-compresses the compressed display data D_INR derived from the input display data generated by the input interface 724, and generates a de-compressed display data D_CR in the color domain DM_1'. The post-processor 726 is aware of a color domain to which the display driver output capability of the DDIC 704 corresponds. Hence, when the color domain DM_1' in which the de-compressor 728 is configured to operate is different from the color domain DM_1 compliant with the display driver output capability, the post-processor 726 performs a color format conversion upon the de-compressed display data D_CR in the color domain DM_1', and generates a de-compressed display D_TR in the desired color domain DM_1 for driving the display panel 701. However, when the color domain DM_1' is identical to the color domain DM_1, the post-processor 726 bypasses the de-compressed display data D_CR without performing any color format conversion upon the de-compressed display data D_CR, and therefore outputs the de-compressed display data D_CR as the de-compressed display D_TR (i.e., D_TR=D_CR).

It should be noted that, concerning the DDIC 704, only the circuit components pertinent to the proposed display data decompression with color format conversion are shown in FIG. 7. In practice, the DDIC 704 may have additional circuit components to achieve other functions.

Figure 8:
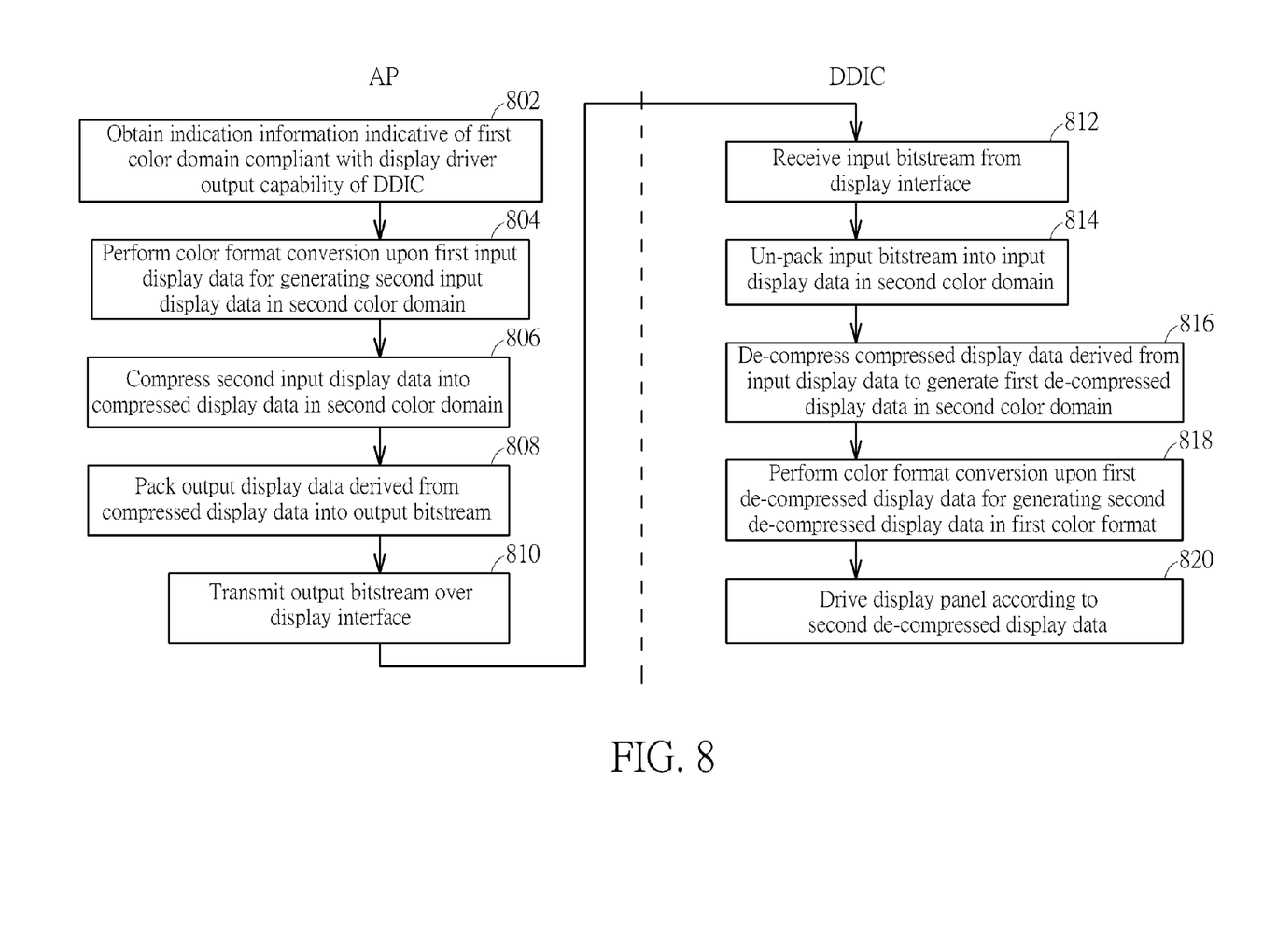
FIG. 8 is a flowchart illustrating yet another data processing method according to an embodiment of the present invention.

FIG. 8 is a flowchart illustrating yet another data processing method according to an embodiment of the present invention. Provided that the result is substantially the same, the steps are not required to be executed in the exact order shown in FIG. 8. The data processing method may be employed by the data processing system 700 shown in FIG. 7, and may be briefly summarized as below.

Step 802: Query a DDIC to obtain indication information indicative of a first color domain compliant with a display driver output capability of the DDIC.

Step 804: Refer to the indication information to perform a color format conversion upon the first input display data for generating a second input display data in a second color domain, where the second color domain is different from the first color domain.

Step 806: Compress the second input display data into a compressed display data in the second color domain.

Step 808: Pack an output display data derived from the compressed display data into an output bitstream.

Step 810: Transmit the output bitstream over a display interface.

Step 812: Receive an input bitstream from the display interface.

Step 814: Un-pack the input bitstream into an input display data in the second color domain.

Step 816: De-compress a compressed display data derived from the input display data to generate a first de-compressed display data in the second color domain.

Step 818: Refer to the display driver output capability of the DDIC to perform a color format conversion upon the first de-compressed display data for generating a second de-compressed display data in the first color format.

Step 820: Drive a display panel according to the second de-compressed display data.

Steps 802-810 are performed at the AP side (i.e., the encoder side), and steps 812-820 are performed at the DDIC side (i.e., the decoder side). As a person skilled in the art can readily understand details of each step shown in FIG. 8 after reading above paragraphs, further description is omitted here for brevity.

Those skilled in the art will readily observe that numerous modifications and alterations of the device and method may be made while retaining the teachings of the invention. Accordingly, the above disclosure should be construed as limited only by the metes and bounds of the appended claims.

The invention claimed is:

1. A data processing apparatus comprising:
a compression circuit, comprising:
a pre-processor, arranged to receive a first input display data in a first color domain, and perform a color format conversion upon the first input display data to generate a second input display data in a second color domain, wherein the second color domain is different from the first color domain; and
a compressor, configured to perform compression in the second color domain, wherein the compressor is arranged to compress the second input display data into a compressed display data in the second color domain; and
an output interface, arranged to pack an output display data derived from the compressed display data into an output bitstream, and output the output bitstream via a display interface.

2. The data processing apparatus of claim 1, wherein the display interface is a display serial interface (DSI) standardized by a Mobile Industry Processor Interface (MIPI) or an embedded display port (eDP) standardized by a Video Electronics Standards Association (VESA).

3. The data processing apparatus of claim 1, wherein the pre-processor is further arranged to receive indication information indicative of the first color domain for referring to the received indication information to convert the first input display data into the second input display data.

4. The data processing apparatus of claim 3, wherein the output interface is further arranged to record the received indication information in the output bitstream.

5. The data processing apparatus of claim 1, wherein the output interface is coupled to one of a plurality of display ports of the display interface, where the display ports correspond to a plurality of partial display regions of a display device, respectively; and the color format conversion is display-port dependent.

6. The data processing apparatus of claim 1, wherein the first input display data is generated under one of a plurality of user operation scenarios; and the color format conversion is user-operation-scenario dependent.

7. The data processing apparatus of claim 1, wherein the output interface is arranged to output the output bitstream to a display driver via the display interface; the display driver is configured to support a display color format; and the color format conversion is display-driver-output-capability dependent.

8. The data processing apparatus of claim 1, wherein the color format conversion comprises:
converting the first input display data into a third input display data in a third color domain by re-shuffling at least one color channel of the first input display data into different color channels of the third input display data, wherein the third color domain is different from the first color domain and the second color domain, and a color channel number of the third input display data is different from a color channel number of the first input display data; and
converting the third input display data into the second color domain.

9. A data processing apparatus comprising:
an input interface, arranged to receive an input bitstream from a display interface, and un-pack the input bitstream into an input display data in a first color domain; and
a decompression circuit, comprising:
de-compressor, configured to perform decompression in the first color domain, wherein the decompression is arranged to de-compress a compressed display data derived from the input display data to generate a first de-compressed display data in the first color domain; and
a post-processor, arranged to perform a color format conversion upon the first de-compressed display data to generate a second de-compressed display data in a second color domain, wherein the second color domain is different from the first color domain.

10. The data processing apparatus of claim 9, wherein the display interface is a display serial interface (DSI) standardized by a Mobile Industry Processor Interface (MIPI) or an embedded display port (eDP) standardized by a Video Electronics Standards Association (VESA).

11. The data processing apparatus of claim 9, wherein the input interface is further arranged to parse indication information indicative of the second color domain from the input bitstream; and the post-processor refers to the parsed indication information to convert the first de-compressed display data into the second de-compressed display data.

12. A data processing method comprising:
receiving a first input display data in a first color domain;
utilizing a pre-processor for performing a color format conversion upon the first input display data to generate a second input display data in a second color domain, wherein the second color domain is different from the first color domain;
performing compression in the second color domain, wherein the compression compresses the second input display data into a compressed display data in the second color domain;
packing an output display data derived from the compressed display data into an output bitstream; and
outputting the output bitstream via a display interface.

13. The data processing method of claim 12, wherein the display interface is a display serial interface (DSI) standardized by a Mobile Industry Processor Interface (MIPI) or an embedded display port (eDP) standardized by a Video Electronics Standards Association (VESA).

14. The data processing method of claim 12, further comprising:
receiving indication information indicative of the first color domain;
wherein the color format conversion refers to the received indication information to convert the first input display data into the second input display data.

15. The data processing method of claim 14, wherein outputting the output bitstream via the display interface further comprises:
recording the received indication information in the output bitstream.

16. The data processing method of claim 12, wherein the output bitstream is transmitted through one of a plurality of display ports of the display interface, where the display ports correspond to a plurality of partial display regions of a display device, respectively; and the color format conversion is display-port dependent.

17. The data processing method of claim 12, wherein the first input display data is generated under one of a plurality of user operation scenarios; and the color format conversion is user-operation-scenario dependent.

18. The data processing method of claim 12, wherein the output bitstream is transmitted to a display driver via the display interface; the display driver is configured to support a display color format; and the color format conversion is display-driver-output-capability dependent.

19. The data processing method of claim 12, wherein the color format conversion comprises:
converting the first input display data into a third input display data in a third color domain by re-shuffling at least one color channel of the first input display data into different color channels of the third input display data, wherein the third color domain is different from the first color domain and the second color domain, and a color channel number of the third input display data is different from a color channel number of the first input display data; and
converting the third input display data into the second color domain.

20. A data processing method comprising:
receiving an input bitstream from a display interface;
un-packing the input bitstream into an input display data in a first color domain;
performing decompression in the first color domain, wherein the decompression de-compresses a compressed display data derived from the input display data to generate a first de-compressed display data in the first color domain; and utilizing a post-processor for performing a color format conversion upon the first de-compressed display data to generate a second de-compressed display data in a second color domain, wherein the second color domain is different from the first color domain.

21. The data processing method of claim 20, wherein the display interface is a display serial interface (DSI) standardized by a Mobile Industry Processor Interface (MIPI) or an embedded display port (eDP) standardized by a Video Electronics Standards Association (VESA).

22. The data processing method of claim 20, further comprising:

parsing indication information indicative of the second color domain from the input bitstream;

wherein the color format conversion refers to the parsed indication information to convert the first de-compressed display data into the second de-compressed display data.

* * * * *